(12) United States Patent
Lin et al.

(10) Patent No.: US 11,875,849 B2
(45) Date of Patent: Jan. 16, 2024

(54) ANALOG CONTENT-ADDRESS MEMORY HAVING APPROXIMATION MATCHING AND OPERATION METHOD THEREOF

(71) Applicant: MACRONIX INTERNATIONAL CO., LTD., Hsinchu (TW)

(72) Inventors: Yu-Hsuan Lin, Taichung (TW); Po-Hao Tseng, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 147 days.

(21) Appl. No.: 17/711,073

(22) Filed: Apr. 1, 2022

(65) Prior Publication Data
US 2023/0317166 A1   Oct. 5, 2023

(51) Int. Cl.
*G11C 15/04* (2006.01)
(52) U.S. Cl.
CPC .................. *G11C 15/046* (2013.01)
(58) Field of Classification Search
CPC .................................................... G11C 15/046
USPC ........................................................ 365/49.1
See application file for complete search history.

(56) References Cited

U.S. PATENT DOCUMENTS

| 2022/0375526 A1* | 11/2022 | Tseng | G11C 16/26 |
| 2023/0307048 A1* | 9/2023 | Li | G11C 15/00 |
| | | | 365/49.17 |

FOREIGN PATENT DOCUMENTS

| TW | I462112 B | 11/2014 |
| TW | I763493 B | 5/2022 |

* cited by examiner

*Primary Examiner* — Connie C Yoha
(74) *Attorney, Agent, or Firm* — McClure, Qualey & Rodack, LLP (57) ABSTRACT

An analog content-address memory (analog CAM) having approximation matching and an operation method thereof are provided. The analog CAM includes an inputting circuit, at least one analog CAM cell and an outputting circuit. The inputting circuit is configured to provide an inputting data. The analog CAM cell is connected to the inputting circuit and receives the inputting data. The analog CAM cell has a mild swing match curve whose highest point corresponds to a stored data. A segment from the highest point of the mild swing match curve to a lowest point of the mild swing match curve corresponds to at least three data values. The outputting circuit is connected to the analog CAM cell and receives a match signal from the analog CAM cell. The outputting circuit outputs a match approximation level according to the match signal.

20 Claims, 12 Drawing Sheets

ANALOG CONTENT-ADDRESS MEMORY HAVING APPROXIMATION MATCHING AND OPERATION METHOD THEREOF

TECHNICAL FIELD

The disclosure relates in general to a memory and an operation method thereof, and more particularly to an analog content-address memory (analog CAM) having approximation matching and an operation method thereof.

BACKGROUND

Along with the development of the memory technology, a content-addressable memory (CAM) is invented. The CAM is a special type of computer memory used in certain very-high-speed searching applications. The CAM may compare an input search word against all rows of stored words in an array in a highly parallel manner. The CAM supplies a very powerful functionality for many applications, especially in pattern matching and search.

Past improvements have been realized by using two Analog CAM cells to search 2 bits data or using three Analog CAM cells to search 3 bits data. Each of the Analog CAM cells is used to store one bit. Please refer to the following table I. If the inputting data is "1" and the stored data in the two Analog CAM cells is "2", the matched bit count is 0. Please refer to the following table II. If the inputting data is "0" and the stored data in the two Analog CAM cells is "2", the matched bit count is 1. Two close numbers may have low matched bit count.

TABLE I

|  |  | decimal format | binary format | |
|---|---|---|---|---|
| Inputting data | | 1 | 0 | 1 |
| Stored data | | 2 | 1 | 0 |
| | Match? | | X | X |

TABLE II

|  |  | decimal format | binary format | |
|---|---|---|---|---|
| Inputting data | | 0 | 0 | 0 |
| Stored data | | 2 | 1 | 0 |
| | Match? | | X | O |

That is, the matched bit count cannot well represent the correlation between two numbers. This will cause accuracy degradation.

SUMMARY

The disclosure is directed to an analog content-address memory (analog CAM) having approximation matching and an operation method thereof. An analog CAM cell has a mild swing match curve, so a match signal can be gradually changed according to a relationship between an inputting data and a stored data, and a match approximation level can be outputted according to the match signal. Therefore, the analog CAM can well represent the correlation between the inputting data and the stored data.

According to one embodiment, an analog content-address memory (analog CAM) having approximation matching is provided. The analog CAM includes an inputting circuit, at least one analog CAM cell and an outputting circuit. The inputting circuit is configured to provide an inputting data. The analog CAM cell is connected to the inputting circuit and receives the inputting data. The analog CAM cell has a mild swing match curve whose highest point corresponds to a stored data. A segment from the highest point of the mild swing match curve to a lowest point of the mild swing match curve corresponds to at least three data values. The outputting circuit is connected to the analog CAM cell and receives a match signal from the analog CAM cell. The outputting circuit outputs a match approximation level according to the match signal.

According to another embodiment, an operation method of an analog content-address memory (analog CAM) having approximation matching is provided. The operation method included the following steps. An inputting data is inputted to at least one analog CAM cell having a mild swing match curve whose highest point corresponds to a stored data. A segment from the highest point of the mild swing match curve to a lowest point of the mild swing match curve corresponds to at least three data values. A match signal is read from the analog CAM cell. A match approximation level is outputted according to the match signal.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
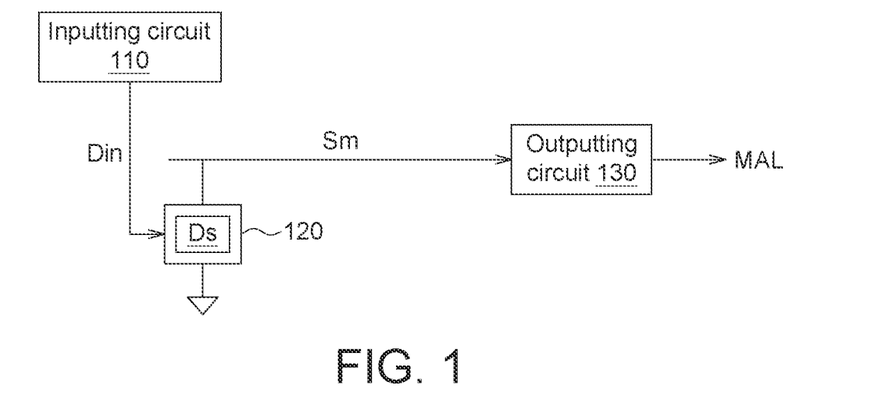
FIG. 1 shows an analog content-address memory (analog CAM) having approximation matching according to one embodiment.

Please referring to FIG. 1, an analog content-address memory (analog CAM) 100 having approximation matching according to one embodiment is shown. In FIG. 1, the analog CAM 100 includes an inputting circuit 110, at least one analog CAM cell 120 and an outputting circuit 130. The inputting circuit 110 is, for example, a word line driver. The inputting circuit 110 provides an inputting data Din. A stored data Ds is stored in the analog CAM cell 120. The analog CAM 100 is, for example, a SONOS memory, MONOS memory, a split gate memory, a ferroelectric field-effect transistor (FeFET) memory, a Non-volatile memory with or without transistor, such as ReRAM, FeRAM, PCM, or FTJ. The outputting circuit 130 is connected to the analog CAM cell 120. The outputting circuit 130 is, for example, a sense amplifier circuit. The outputting circuit 130 receives a match signal Sm from the analog CAM cell 120.

In the present embodiment, the match signal Sm is gradually changed according to a relationship between the inputting data Din and the stored data Ds. The outputting circuit 130 outputs a match approximation level MAL according to the match signal Sm.

Figure 2:
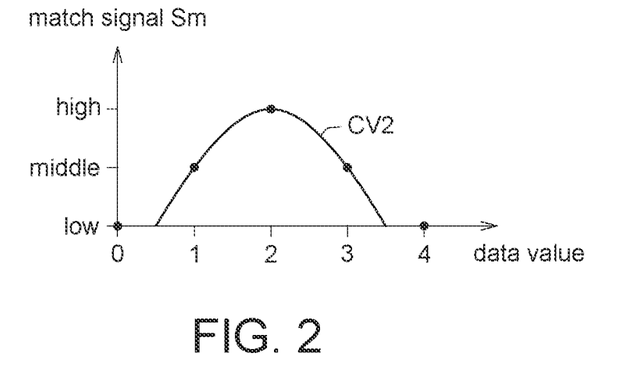
FIG. 2 illustrates a mild swing match curve of the analog CAM cell according to one embodiment.

Please refer to FIG. 2, which illustrates a mild swing match curve CV2 of the analog CAM cell 120 according to one embodiment. "0", "1", "2", "3" "4" on the horizontal axis represent different data values. The vertical axis represents the match signal Sm. The match signal Sm is, for example, a current, a voltage or a charge. In FIG. 2, the stored data Ds in the analog CAM cell 120 is "2." The highest point of the mild swing match curve CV2 corresponds to the data value "2" of the stored data Ds. As shown in the left half of the mild swing match curve CV2, the mild swing match curve CV2 corresponds to three data values "0", "1" and "2" from the lowest point to the highest point. From "0" to "2", the mild swing match curve CV2 is gradually raised. As shown in the right half of the mild swing match curve CV2, the mild swing match curve CV2 corresponds to three data values "2", "3" and "4" from the highest point to the lowest point. From "2" to "4", the mild swing match curve CV2 is gradually declined. If the inputting data Din is "2", the match signal Sm is high and the match approximation level MAL outputted from the outputting circuit 130 is "high." If the inputting data Din is "0" or "4", the match signal Sm is low and the match approximation level MAL outputted from the outputting circuit 130 is "low." If the inputting data Din is "1" or "3", the match signal Sm is middle and the match approximation level MAL outputted from the outputting circuit 130 is "middle." Therefore, the analog CAM 100 can well represent the correlation between the inputting data Din and the stored data Ds.

Figure 3:
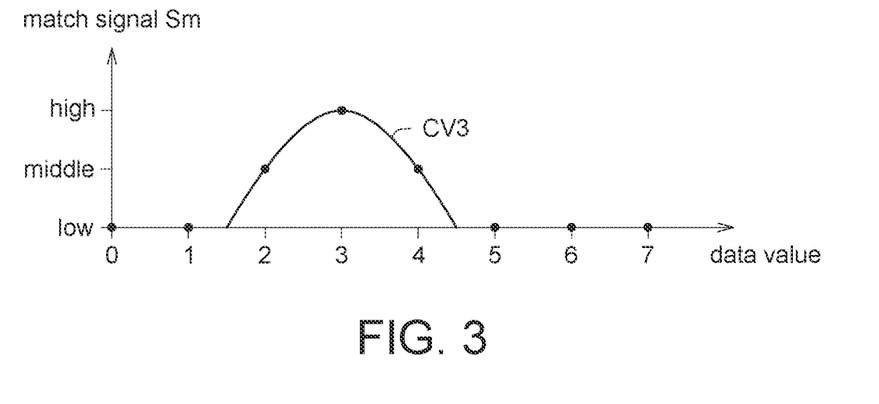
FIG. 3 illustrates the mild swing match curve of the analog CAM cell according to another embodiment.

Please refer to FIG. 3, which illustrates the mild swing match curve CV3 of the analog CAM cell 120 according to another embodiment. "0", "1", "2", "3", "4", "5", "6", "7" on the horizontal axis represent different data values. In FIG. 3, the stored data in the analog CAM cell 120 is "3." The highest point of the mild swing match curve CV3 corresponds to the data value "3" of the stored data Ds. As shown in the left half of the mild swing match curve CV3, the mild swing match curve CV3 corresponds to four data values "0", "1", "2" and "3" from the lowest point to the highest point. From "1" to "3", the mild swing match curve CV3 is gradually raised. As shown in the right half of the mild swing match curve CV3, the mild swing match curve CV3 corresponds to five data values "3", "4", "5", "6", and "7" from the highest point to the lowest point. From "3" to "5", the mild swing match curve CV3 is gradually declined. If the inputting data Din is "3", the match signal Sm is high and the match approximation level MAL outputted from the outputting circuit 130 is "high." If the inputting data Din is "0", "1", "5", "6" or "7", the match signal Sm is low and the match approximation level MAL outputted from the outputting circuit 130 is "low." If the inputting data Din is "2" or "4", the match signal Sm is middle and the match approximation level MAL outputted from the outputting circuit 130 is "middle." Therefore, the analog CAM 100 can well represent the correlation between the inputting data Din and the stored data Ds.

Figure 4:
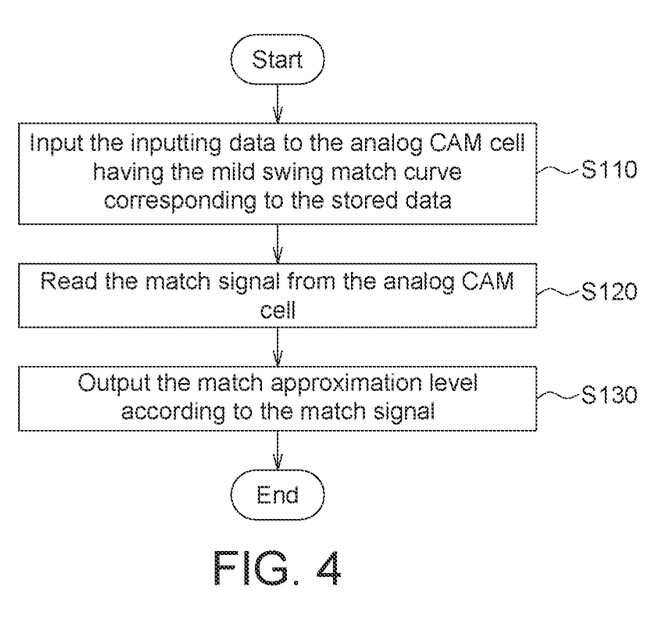
FIG. 4 shows a flowchart of an operation method of the analog CAM having approximation matching.

Please refer to FIG. 4, which shows a flowchart of an operation method of the analog CAM 100 having approximation matching. In step S110, the inputting data Din is inputted to the analog CAM cell 120 having the mild swing match curve CV2 or CV3 corresponding to the stored data Ds.

In step S120, the outputting circuit 130 reads the match signal Sm from the analog CAM cell 120. The match signal Sm is gradually changed according to the relationship between the inputting data Din and the stored data Ds.

In step S130, the outputting circuit 130 outputs the match approximation level MAL according to the match signal Sm. The analog CAM 100 can well represent the correlation between the inputting data Din and the stored data Ds.

Figure 5A:
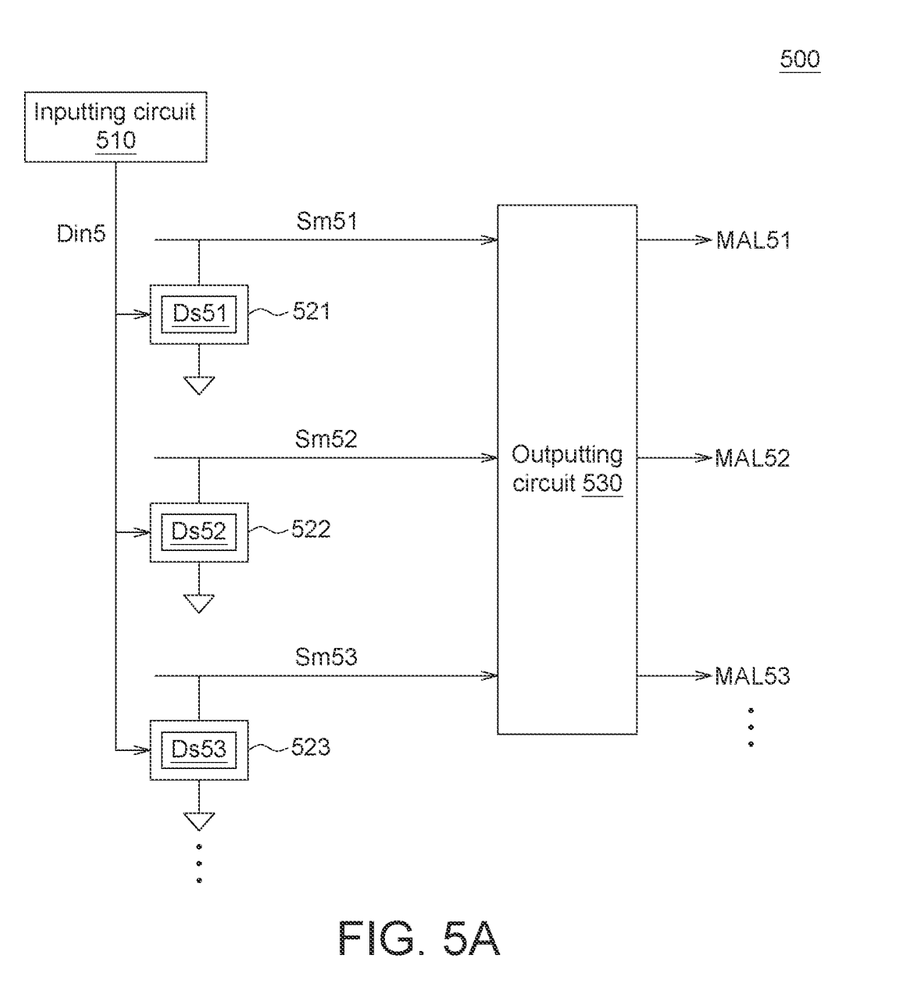
FIG. 5A shows an analog CAM having approximation matching according to one embodiment.

Please referring to FIG. 5A, an analog CAM 500 having approximation matching according to one embodiment is shown. In FIG. 5A, the analog CAM 500 includes an inputting circuit 510, a plurality of analog CAM cells 521, 522, 523, . . . and an outputting circuit 530. The inputting circuit 510 provides an inputting data Din5. A plurality of different stored data Ds51, Ds52, Ds53, . . . are respectively stored in the analog CAM cells 521, 522, 523, . . . . The outputting circuit 530 is connected to the analog CAM cells 521, 522, 523, . . . . The outputting circuit 530 respectively receives a plurality of match signals Sm51, Sm52, Sm53, . . . , from the analog CAM cells 521, 522, 523, . . . . Each of the match signals Sm51, Sm52, Sm53, . . . is gradually changed according to a relationship between the inputting data Din5 and the stored data Ds51, Ds52, Ds53, . . . . The outputting circuit 530 respectively outputs a plurality of match approximation levels MAL51, MAL52, MAL53, . . . according to the match signals Sm51, Sm52, Sm53, . . . .

Figure 5B:
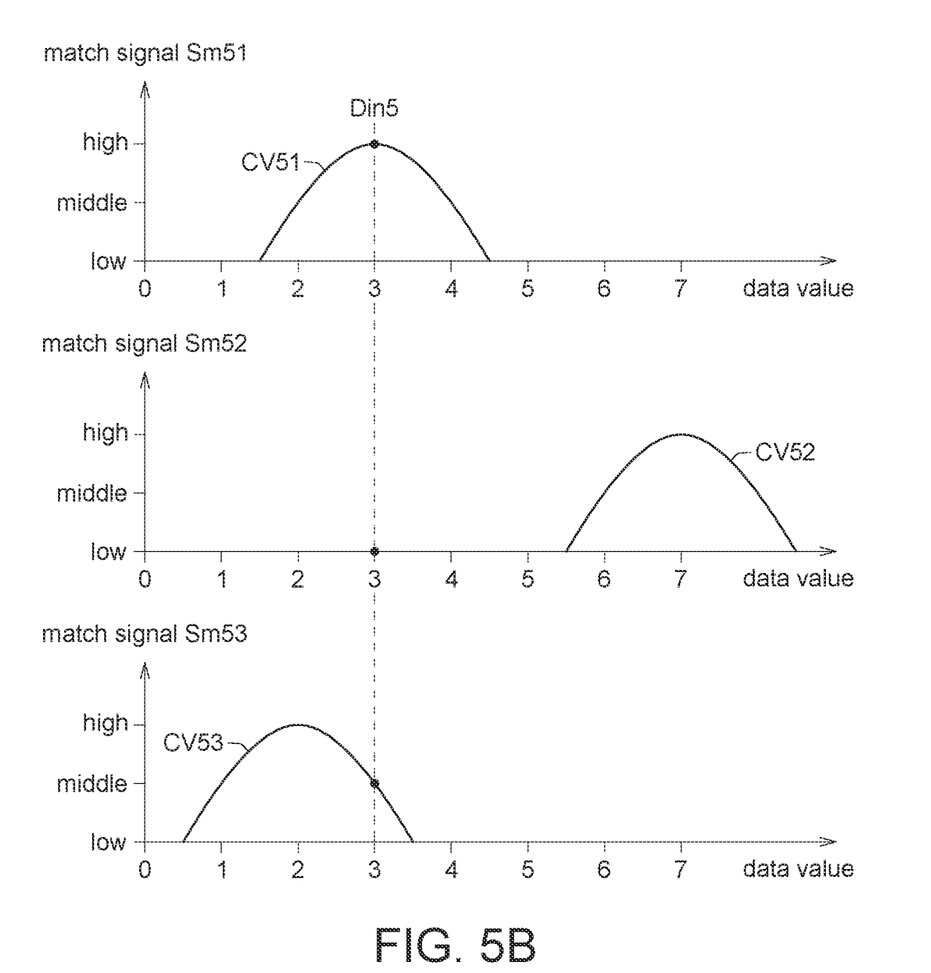
FIG. 5B illustrates a plurality of mild swing match curves according to one embodiment.

Please refer to FIG. 5B, which illustrates a plurality of mild swing match curves CV51, CV52, CV53 of the analog CAM cells 521, 522, 523 according to one embodiment. In FIG. 5B, the stored data Ds51 in the analog CAM cell 521 is "3", the stored data Ds52 in the analog CAM cell 522 is "7", and the stored data Ds53 in the analog CAM cell 523 is "2." The inputting data Din5 is "3." The match signal Sm51 is high and the match approximation level MAL51 outputted from the outputting circuit 530 is "high." The match signal Sm52 is low and the match approximation level MAL52 outputted from the outputting circuit 130 is "low." The match signal Sm53 is middle and the match approximation level MAL53 outputted from the outputting circuit 130 is "middle." Therefore, the analog CAM 500 can well represent the correlation between the inputting data Din5 and each of the stored data Ds51, Ds52, Ds53.

As shown in FIGS. 2, 3 and 5B, the mild swing match curves CV2, CV3, CV51, CV52, CV53 are symmetric, so each of the match approximation levels MAL, MAL51, MAL52, MAL53 is symmetric at two sides of the stored data.

Figure 6A:
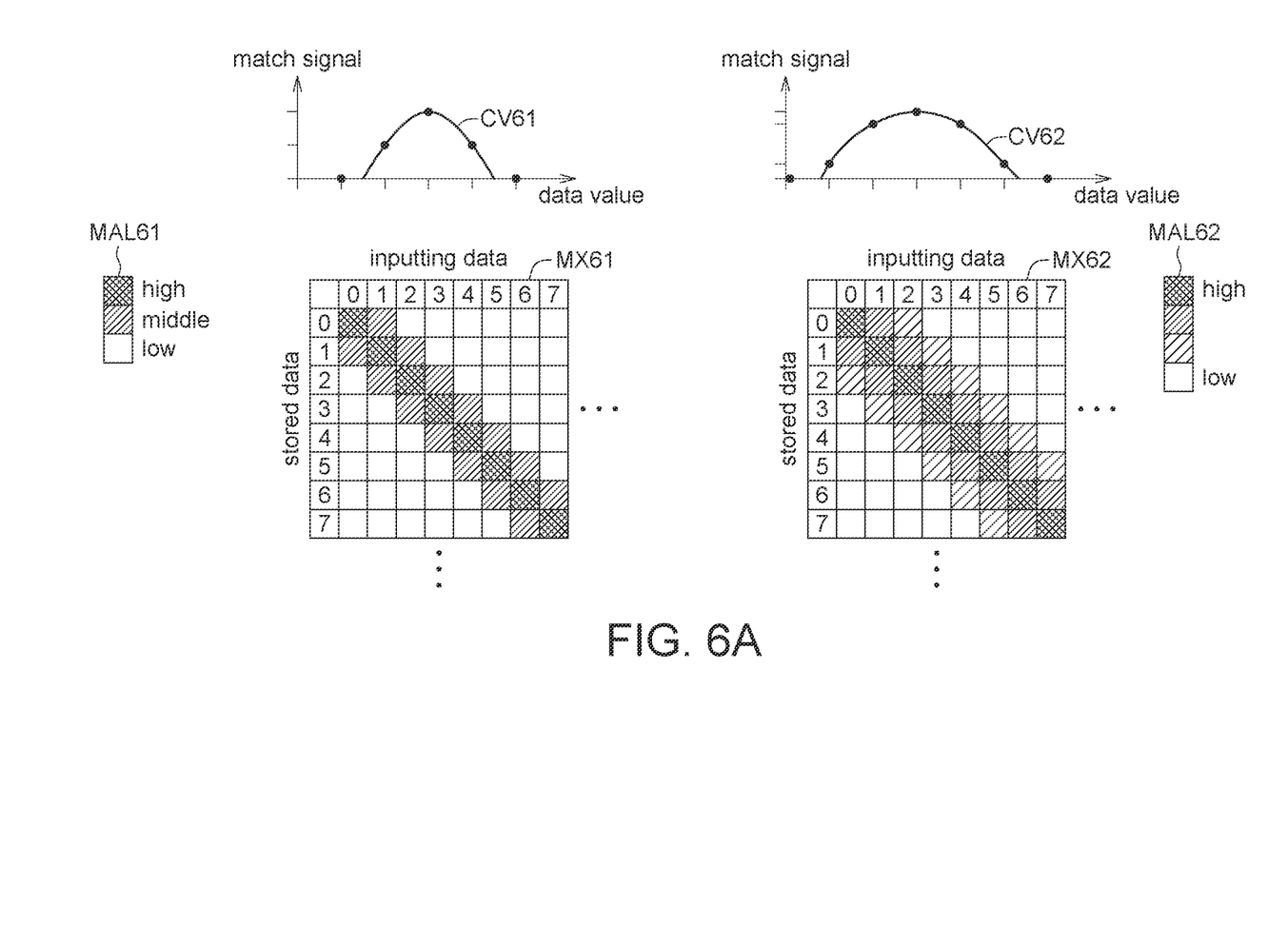
FIG. 6A shows two mild swing match curves according to one embodiment.

As shown in FIGS. 2, 3 and 5B, each of the match approximation level MAL, MAL51, MAL52, MAL53 has three grades. In another embodiment, the match approximation level may have more than three grades. Please referring to FIG. 6A, two mild swing match curves CV61, CV62 according to one embodiment are shown. The match approximation level MAL61 corresponding to the mild swing match curves CV61 has three grades; the match approximation level MAL62 corresponding to the mild swing match curves CV62 has four grades. As shown in FIG. 6A, the match approximation level MAL61 between all of the inputting data and all of the stored data is shown in a matrix MX61. In the matrix MX61, 8 entries are "high", 14 entries are "middle" and 42 entries are "low." The match approximation level MAL62 between all of the inputting data and all of the stored data is shown in a matrix MX62. In the matrix MX62, 8 entries are "high", 14 entries are "high in the middle", 12 entries are "low in the middle" and 30 entries are "low." The more the number of the grades, the higher the precision.

Figure 6B:
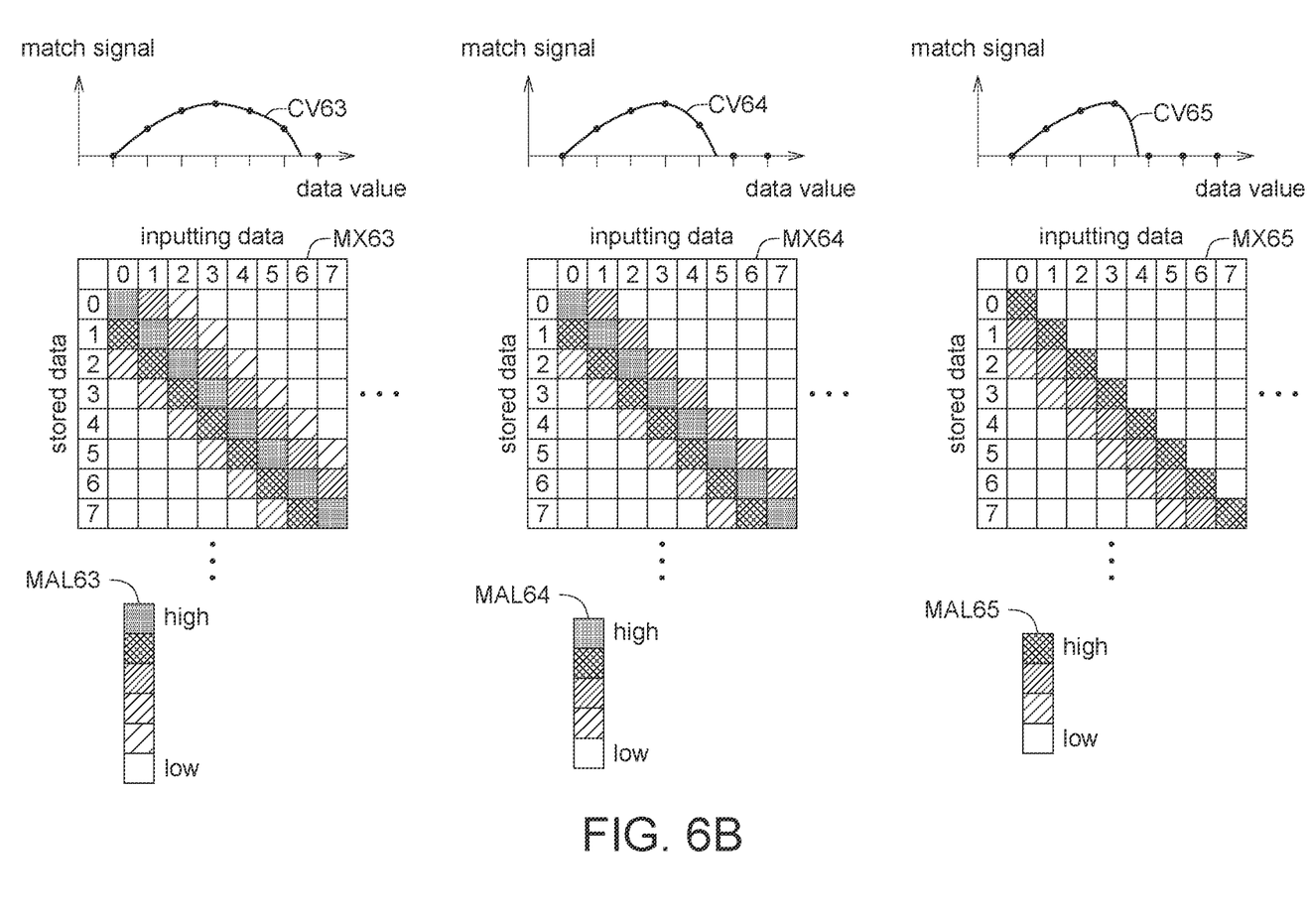
FIG. 6B shows three mild swing match curves according to one embodiment.

The above-mentioned mild swing match curves CV61 and CV62 have symmetry. In another embodiment, the mild swing match curve can also be asymmetric. Please referring to FIG. 6B three mild swing match curves CV63, CV64, CV65 according to one embodiment are shown. The match approximation level MAL63 corresponding to the mild swing match curves CV63 has six grades; the match approximation level MAL64 corresponding to the mild swing match curves CV64 has five grades; the match approximation level MAL65 corresponding to the mild swing match curves CV65 has four grades. As shown in FIG. 6B, the match approximation level MAL63 between all of the inputting data and all of the stored data is shown in a matrix MX63; the match approximation level MAL64 between all of the inputting data and all of the stored data is shown in a matrix MX64; the match approximation level MAL65 between all of the inputting data and all of the stored data is shown in a matrix MX65.

Figure 7:
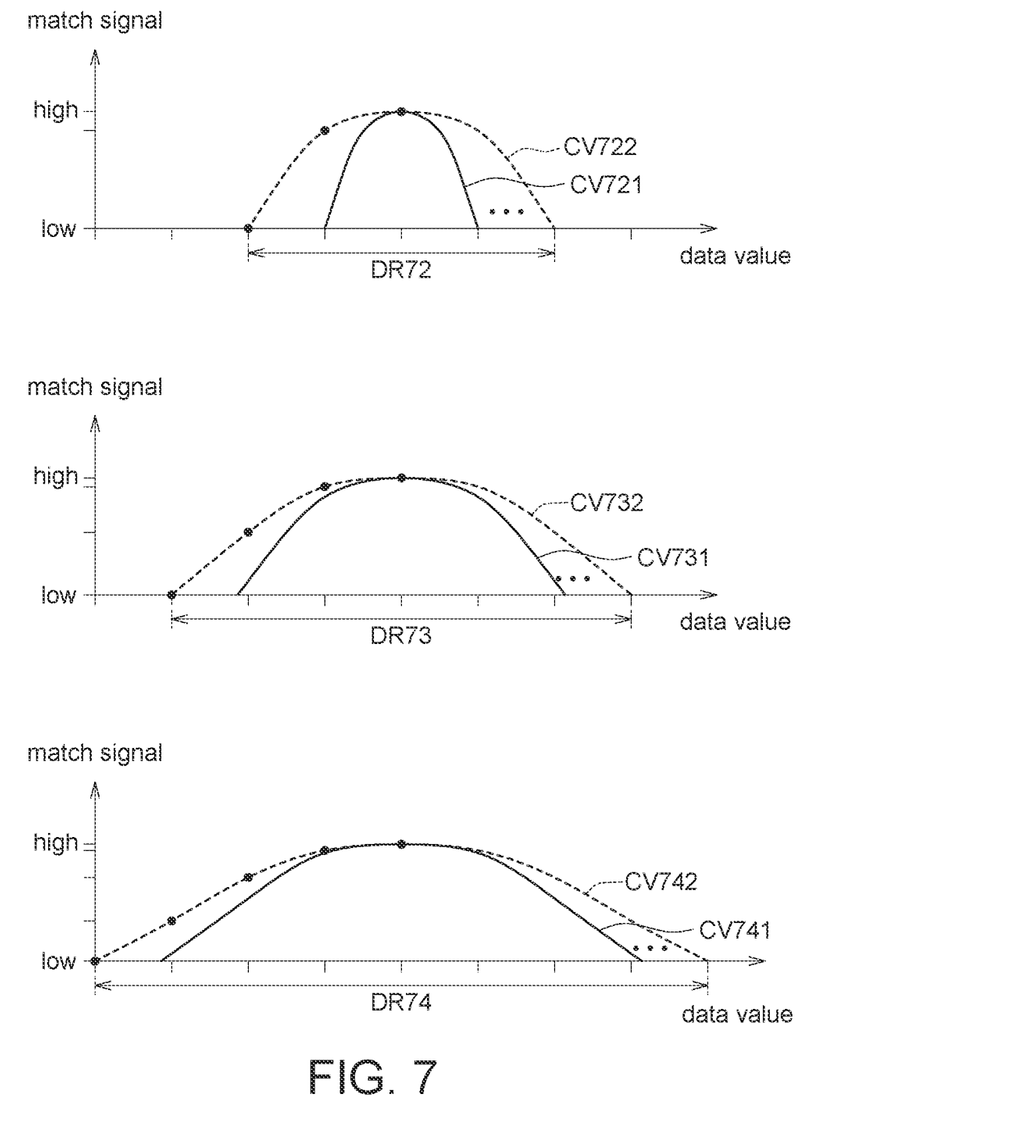
FIG. 7 illustrates the relationship between the data range of the stored data and the number of the grades.

Please refer to FIG. 7, which illustrates the relationship between the data range of the stored data and the number of the grades. As shown in the mild swing match curves CV711 to CV712, if the data range DR71 is from 1 to 3, the maximum number of the grades can be 2. As shown in the mild swing match curves CV721 to CV722, if the data range DR72 is from 3 to 5, the maximum number of the grades can be 3. As shown in the mild swing match curves CV731 to CV732, if the data range DR73 is from 5 to 7, the maximum number of the grades can be 4. As shown in the mild swing match curves CV741 to CV742, if the data range DR74 is from 7 to 9, the maximum number of the grades can be 5. That is, the larger the data range, the more the number of the grades.

Figure 8:
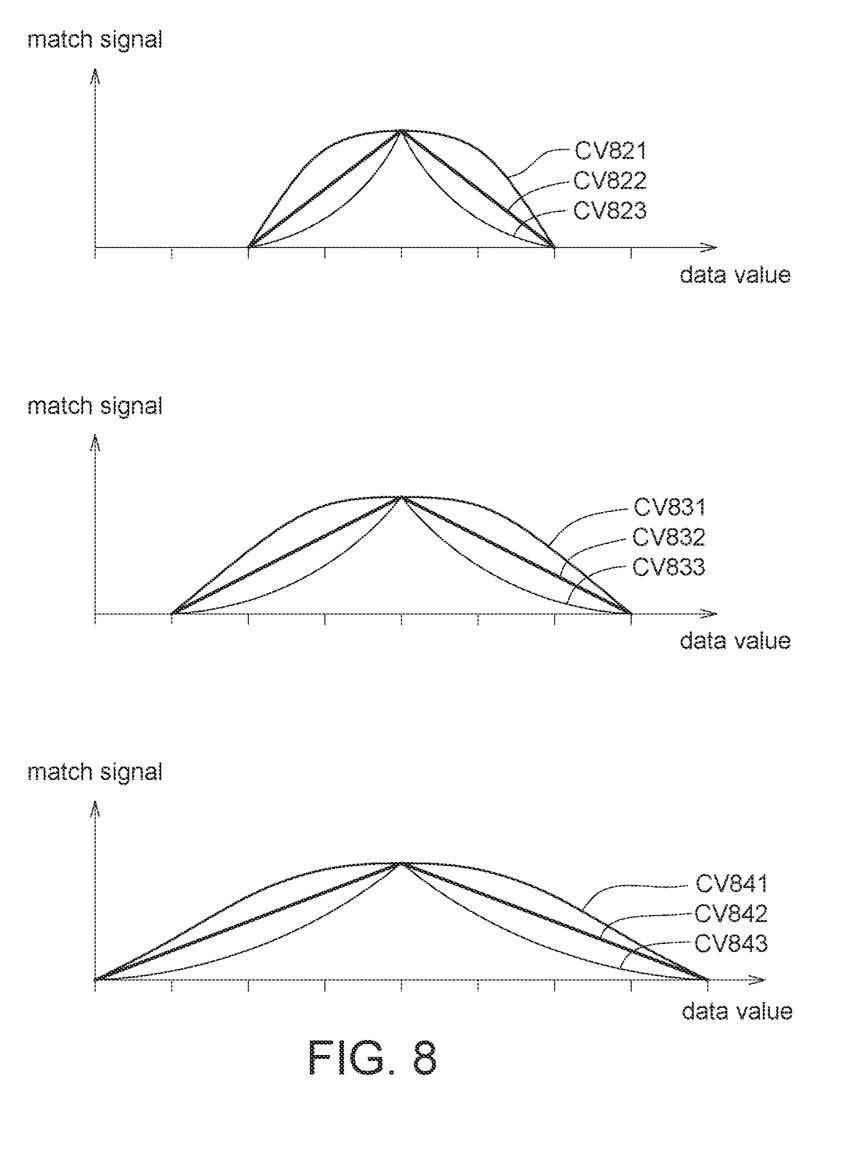
FIG. 8 illustrates different shapes of a plurality of mild swing match curves.

Please refer to FIG. 8 which illustrates different shapes of a plurality of mild swing match curves CV811, CV812, CV813, CV821, CV822, CV823, CV831, CV832, CV833, CV841, CV842, CV843. Each of the mild swing match curves CV811, CV821, CV831, CV841 has a logarithmic scale and is concave downward. Each of the mild swing match curves CV812, CV822, CV832, CV842 has a linear scale. Each of the mild swing match curves CV813, CV823, CV833, CV843 has a logarithmic scale and is concave upward. The number of the grades is not affected regardless of the shape of the mild swing match curve.

Figure 9:
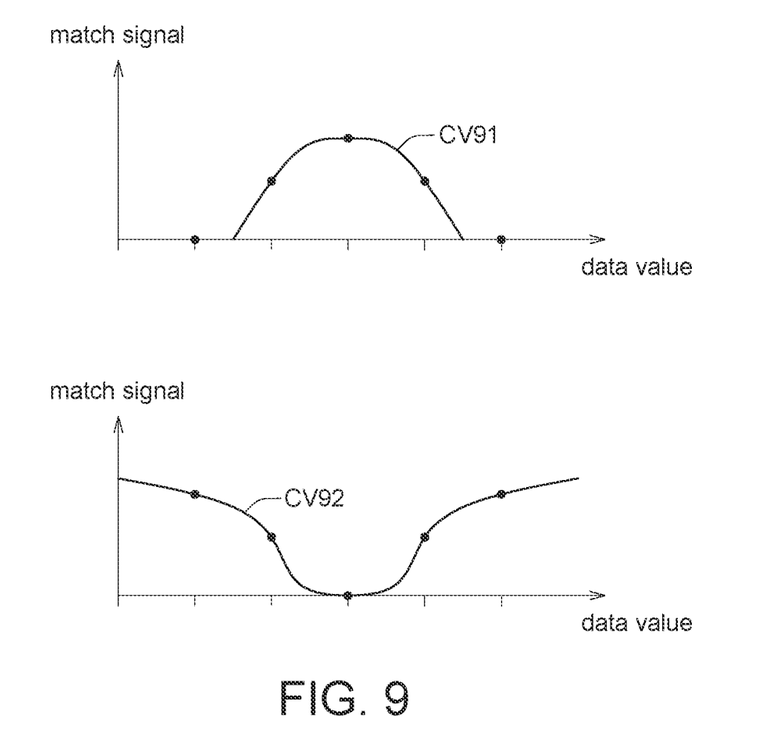
FIG. 9 illustrates different type of two mild swing match curves.

Please refer to FIG. 9, which illustrates different type of two mild swing match curves CV91, CV92. As shown in the mild swing match curve CV91, the mild swing match curve CV91 is bell shaped, and the center is higher than two sides. As shown in the mild swing match curve CV92, the mild swing match curve CV92 is valley shaped, and the center is lower than two sides. Whether the mild swing match curve is bell shaped or valley shaped is depended on whether the match signal is the current, the voltage or the charge.

Figure 10:
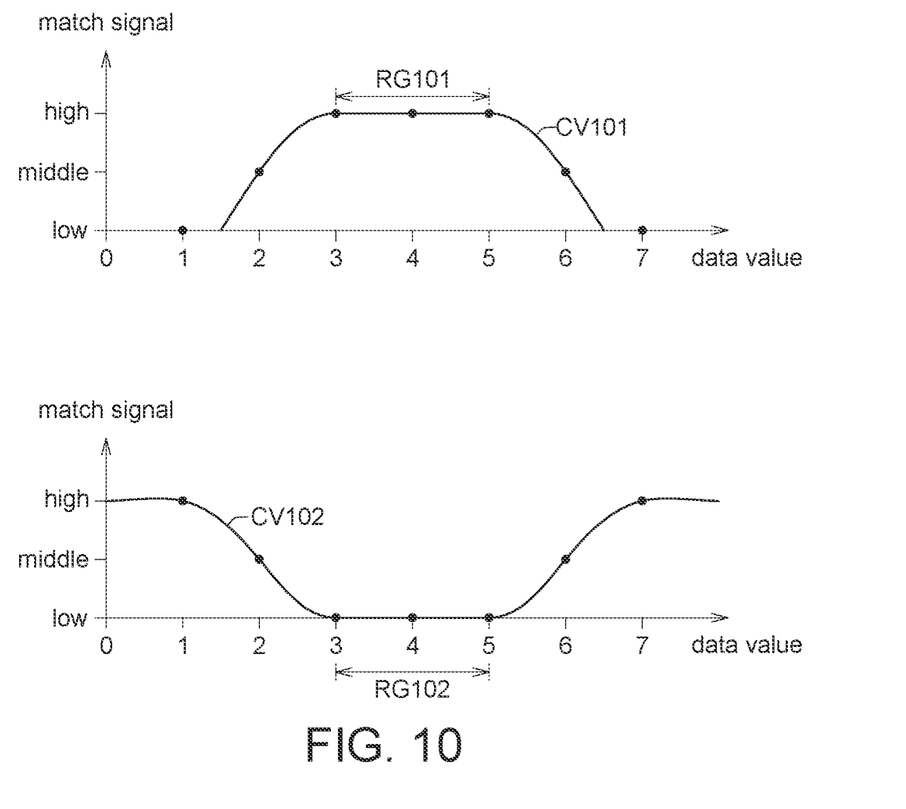
FIG. 10 illustrates the match ranges of different mild swing match curves.

Please refer to FIG. 10, which illustrates the match ranges RG101, RG102 of different mild swing match curves CV101, CV102. As shown in the mild swing match curve CV101, a top of the mild swing match curve CV101 is flat and the size of the match ranges RG101 is 3. For example, the mild swing match curve CV101 corresponds to "3", "4","5." As shown in the mild swing match curve CV102, a bottom of the mild swing match curve CV102 is flat and the size of the match ranges RG102 is 3. For example, the mild swing match curve CV102 corresponds to "3", "4", "5." The he size of the match ranges is tunable depended on the stored data.

Figure 11:
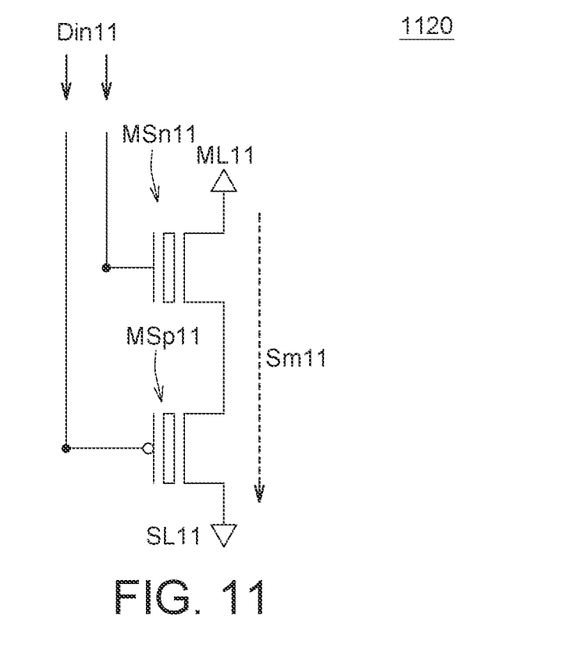
FIG. 11 shows an analog CAM cell according to one embodiment.

Please refer to FIG. 11, which shows an analog CAM cell 1120 according to one embodiment. The analog CAM cell 1120 may include a first floating gate device MSn11 having a N type channel, and a second floating gate device MSp11 having a P type channel. The first floating gate device MSn11 is, for example, a PMOS transistor; the second floating gate device MSp11 is, for example, a NMOS transistor. The first floating gate device Msn11 is connected to a matching line ML11. The second floating gate device MSp11 is connected to a source line SL11.

As shown in FIG. 11, the first floating gate device MSn11 and the second floating gate device MSp11 are connected in series. The first floating gate device MSn11 and the second floating gate device MSp11 simultaneously receive the inputting data Din11. A match signal Sm11 is gradually changed according to a relationship between the inputting data Din11 and the stored data in the analog CAM cell 1120.

Figure 12:
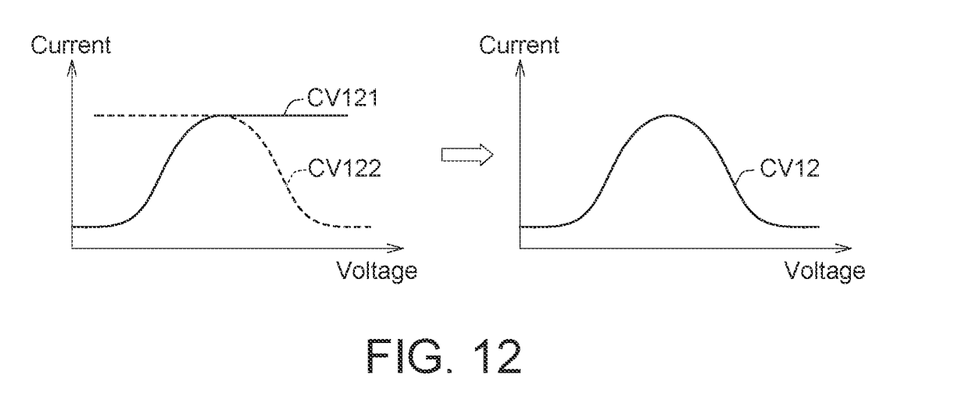
FIG. 12 illustrates forming a mild swing match curve of the analog CAM cell.

Please refer to FIG. 12, which illustrates forming a mild s ng match curve CV12 of the analog CAM cell 1120. The mild swing match curve CV12 is set through programming the first floating gate device MSn11 and the second floating gate device MSp11. For example, an ascending segment of mild swing match curve CV12 is part of a characteristic curve CV121 of the first floating gate device MSn11, and is set through the first floating gate device MSn11. A descending segment of the mild swing match curve CV12 is part of a characteristic curve CV122 of the second floating gate device MSp11, and is set through the second floating gate device MSp11.

Figure 13:
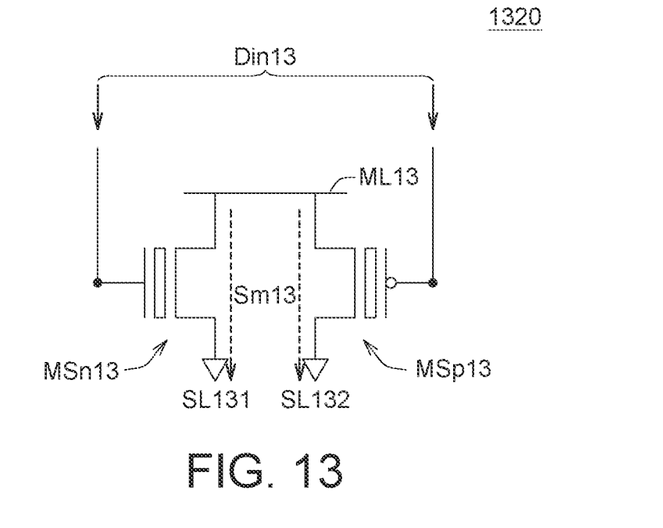
FIG. 13 shows an analog CAM cell according to one embodiment.

Please refer to FIG. 13, which shows an analog CAM cell 1320 according to one embodiment. The analog CAM cell 1320 may include a first floating gate device MSn13 having a N type channel, and a second floating gate device MSp13 having a P type channel. The first floating gate device MSn13 is, for example, a PMOS transistor; the second floating gate device MSp13 is, for example, a NMOS transistor. The first floating gate device Msn13 is connected to a matching line ML13 and a source line SL131. The second floating gate device MSp13 is connected to the matching line ML13 and a source line SL132.

As shown in FIG. 13, the first floating gate device MSn13 and the second floating gate device MSp13 are connected in parallel. The first floating gate device MSn13 and the second floating gate device MSp13 simultaneously receive the inputting data Din13. A match signal Sm13 is gradually changed according to a relationship between the inputting data Din13 and the stored data in the analog CAM cell 1320.

Figure 14:
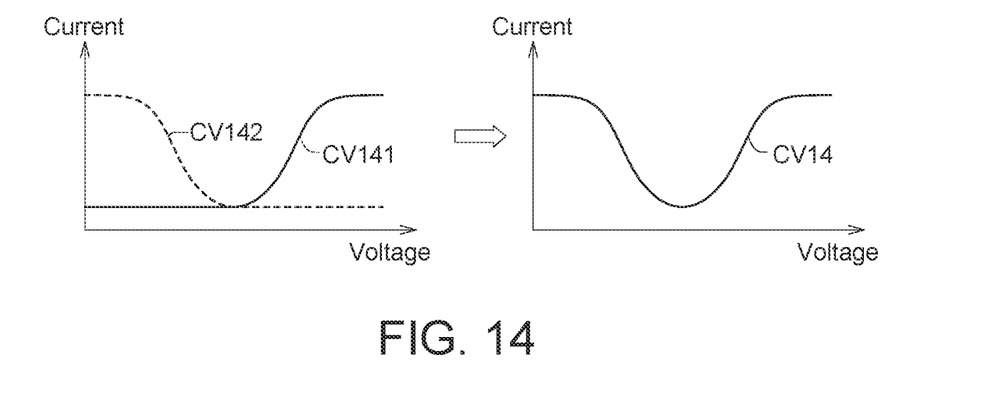
FIG. 14 illustrates forming a mild swing match curve of the analog CAM cell.

Please refer to FIG. 14, which illustrates forming a mild swing match curve CV14 of the analog CAM cell 1320. The mild swing match curve CV14 is set through programming the first floating gate device MSn13 and the second floating gate device MSp13. For example, an ascending segment of mild swing match curve CV14 is part of a characteristic curve CV141 of the first floating gate device MSn13 and is set through the first floating gate device MSn13. A descending segment of the mild swing match curve CV14 is part of a characteristic curve CV142 of the second floating gate device MSp13, and is set through the second floating gate device MSp13.

According to the embodiment described above, the analog CAM cell has the mild swing match curve, so the match signal can be gradually changed according to the relationship between the inputting data and the stored data, and the match approximation level can be outputted according to the match signal. Therefore, the analog CAM can well represent the correlation between the inputting data and the stored data.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An analog content-address memory (analog CAM) having approximation matching, comprising:
    an inputting circuit, configured to provide an inputting data;
    at least one analog CAM cell, connected to the inputting circuit and receive the inputting data, wherein the analog CAM cell has a mild swing match curve whose highest point corresponds to a stored data, wherein a segment from the highest point of the mild swing match curve to a lowest point of the mild swing match curve corresponds to at least three data values; and
    an outputting circuit, connected to the analog CAM cell and receive a match signal from the analog CAM cell, wherein the outputting circuit outputs a match approximation level according to the match signal.

2. The analog CAM according to claim 1, wherein the mild swing match curve is symmetric.

3. The analog CAM according to claim 1, wherein the mild swing match curve is bell shaped or valley shaped.

4. The analog CAM according to claim 1, wherein the match approximation level has more than two grades.

5. The analog CAM according to claim 1; wherein the match signal is a current, a voltage or a charge.

6. The analog CAM according to claim 1, wherein the mild swing match curve has a linear scale or a logarithmic scale.

7. The analog CAM according to claim 1, wherein a top or a bottom of the mild swing match curve is flat.

8. The analog CAM according to claim 1, wherein the analog CAM cell includes:
    a first floating gate device having a N type channel; and
    a second floating gate device having a P type channel;
    wherein the first floating gate device and the second floating gate device are connected in series or in parallel, the mild swing match curve is set through programming the first floating gate device and the second floating gate device, and the first floating gate device and the second floating gate device of the analog CAM cell are configured to receive the inputting data.

9. The analog CAM according to claim 8, wherein an ascending segment of the mild swing match curve is set through the first floating gate device, and a descending segment of the mild swing match curve is set through the second floating gate device.

10. The analog CAM according to claim 8, wherein the first floating gate device and the second floating gate device simultaneously receive the inputting data.

11. An operation method of an analog content-address memory (analog CAM) having approximation matching, comprising:
    inputting an inputting data to at least one analog CAM cell having a mild swing match curve whose highest point corresponds to a stored data, wherein a segment from the highest point of the mild swing match curve to a lowest point of the mild swing match curve corresponds to at least three data values;
    reading a match signal from the analog CAM cell; and
    outputting a match approximation level according to the match signal.

12. The operation method of the analog CAM according to claim 11, wherein the mild swing match curve is symmetric.

13. The operation method of the analog CAM according to claim 11, wherein the mild swing match curve is bell shaped or valley shaped.

14. The operation method of the analog CAM according to claim 11, wherein the match approximation level has more than two grades.

15. The operation method of the analog CAM according to claim 11, wherein the match signal is a current, a voltage or a charge.

16. The operation method of the analog CAM according to claim 11, wherein the mild swing match curve has a linear scale or a logarithmic scale.

17. The operation method of the analog CAM according to claim 11, wherein a top or a bottom of the mild swing match curve is flat.

18. The operation method of the analog CAM according to claim 11, wherein the analog CAM cell includes a first floating gate device having a N type channel and a second floating gate device having a P type channel:
    the first floating gate device and the second floating gate device are connected in series or in parallel, the mild swing match curve is set through programming the first floating gate device and the second floating gate device, and the first floating gate device and the second floating gate device of the analog CAM cell are configured to receive the inputting data.

19. The operation method of the analog CAM according to claim 18, wherein an ascending segment of the mild swing match curve is set through the first floating gate device, and a descending segment of the mild swing match curve is set through the second floating gate device.

20. The operation method of the analog CAM according to claim 18, wherein the first floating gate device and the second floating gate device simultaneously receive the inputting data.

* * * * *